United States Patent [19]

Uslar

[11] Patent Number: 4,572,367
[45] Date of Patent: Feb. 25, 1986

[54] APPARATUS FOR SHIPPING NAIL HEAD LEADS AND LOADING THE SAME INTO A MANUFACTURING FIXTURE

[76] Inventor: George C. Uslar, Fawn Hill Dr., Box 212, New Vernon, N.J. 07976

[21] Appl. No.: 358,895

[22] Filed: Mar. 17, 1982

[51] Int. Cl.[4] ...................... B65D 73/02; B65D 85/42
[52] U.S. Cl. .................................. 206/328; 220/23.8; 220/85 H; 206/577; 206/563
[58] Field of Search .................... 220/23.8, 85 H, 401; 206/328, 577, 562, 563; 53/392

[56] References Cited

U.S. PATENT DOCUMENTS

| | | | |
|---|---|---|---|
| 2,821,327 | 1/1958 | Glazer | 220/23.8 |
| 3,057,510 | 10/1962 | Blacker | 220/23.8 |
| 3,460,899 | 8/1969 | Miller | 220/23.8 |
| 3,565,321 | 2/1971 | Weiss | 220/23.8 |
| 4,154,795 | 5/1979 | Thorne | 220/23.8 |
| 4,386,703 | 6/1983 | Thompson et al. | 220/23.8 |

FOREIGN PATENT DOCUMENTS

| | | | |
|---|---|---|---|
| 759257 | 5/1971 | Belgium | 220/85 H |
| 83916 | 11/1957 | Denmark | 220/85 H |

Primary Examiner—Joseph Man-Fu Moy
Attorney, Agent, or Firm—H. Hume Mathews; Ronald G. Goebel

[57] ABSTRACT

A novel two part loading fixture in which one part is a shipping tray in which electrical leads are shipped by the lead manufacturer to the manufacturer of the electronic devices in which the leads are to be incorporated, and another part is a rigid frame for use by the device manufacturer for locating said tray relative to the holes of a transfer plate.

7 Claims, 4 Drawing Figures

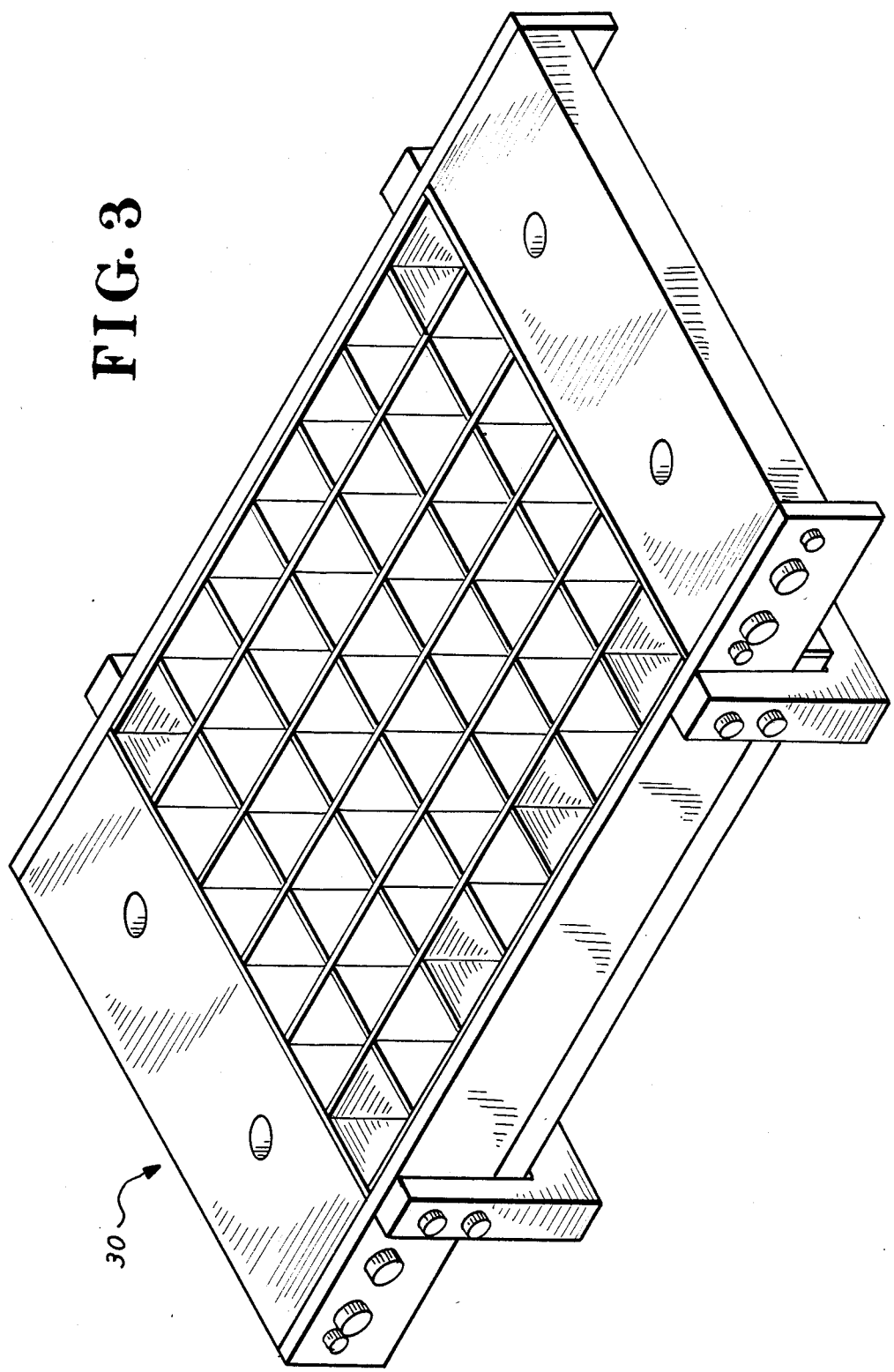

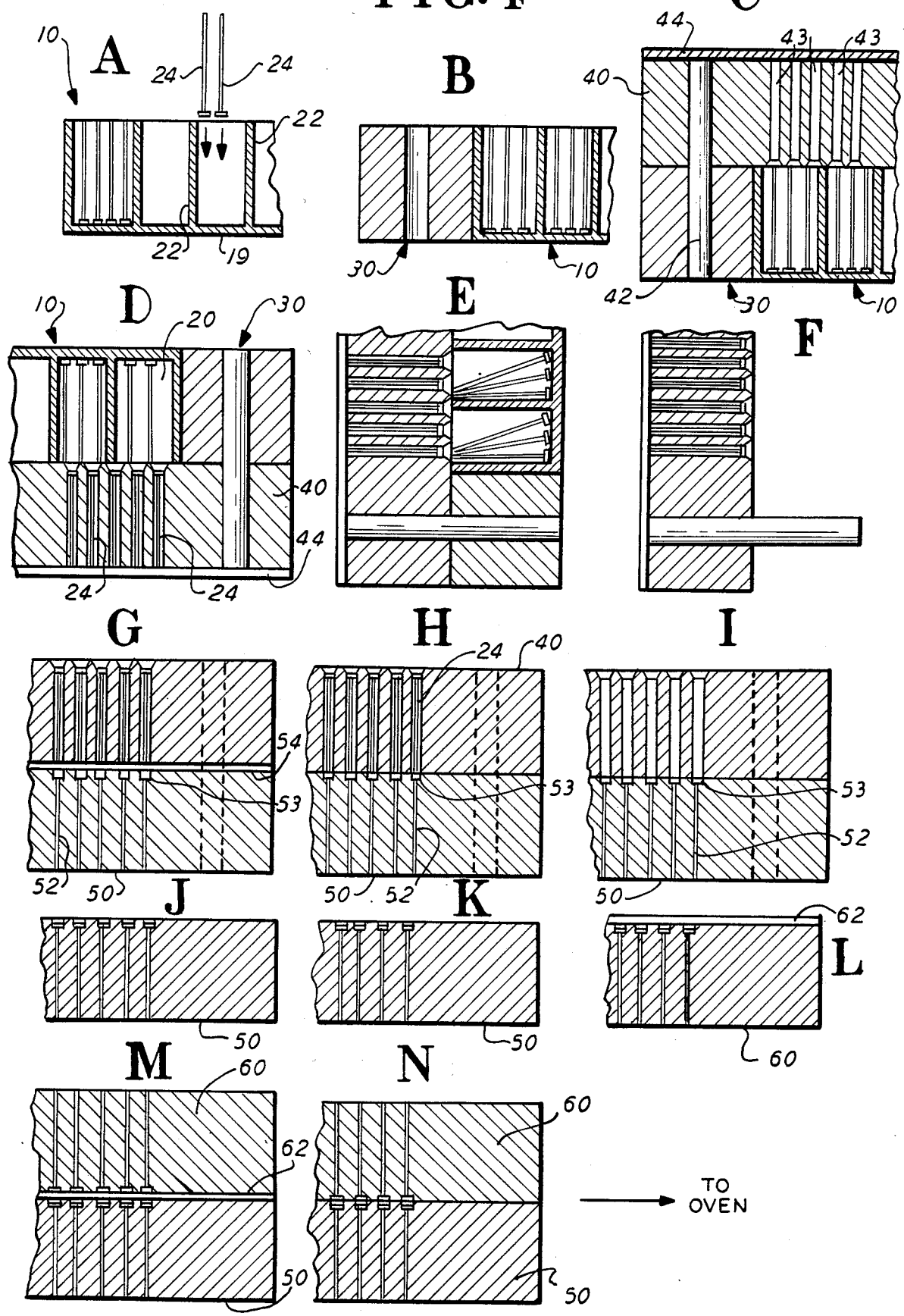

APPARATUS FOR SHIPPING NAIL HEAD LEADS AND LOADING THE SAME INTO A MANUFACTURING FIXTURE

TECHNICAL FIELD

This invention is in the field of the shipping and the assembly of nail head leads into axial lead electronic devices, such as capacitors, diodes and semi-conductors.

BACKGROUND ART

Nail head leads are conventionally packed by the lead manufacturer in envelopes of plastic film or plastic bottles or other containers and then shipped to the manufacturer who uses them in the manufacture of electronic devices.

The electronic device manufacturer removes the leads from the shipping containers, orients them, if necessary, and places them as discrete leads, by hand, into the compartments of a fixture, (herein called a "loading fixture"). The loading fixture, filled with leads, is attached to a transfer plate, having a large number of holes therein, each of which is formed so as to receive one nail head lead. The holes are aligned with the compartments of the loading fixture so that, when the loading fixture loaded with leads is attached to a transfer plate and the fixture and plate shaken together, as a unit, the leads in the compartments will pass into the holes of the transfer plate, until each hole in the transfer plate will be filled with a single lead, with all leads oriented in one direction. Enough leads are placed in the compartments of the loading fixture to fill all the holes of several transfer plates.

The transfer plate, with all the holes therein filled with nail head leads, is then placed on and secured to one part of a two part carbon plate or boat fixture, each part of which (upper and lower) has a large number of holes therein, each of which corresponds to one of the holes in the transfer plate. A transfer plate, loaded with leads, is placed on and secured to one of the two parts of the carbon boat fixture and the two may be shaken if necessary until all the leads in the transfer plate are transferred to the holes in part of the carbon boat fixture secured thereto. This procedure is repeated with the other part of the carbon boat fixture, and another transfer plate loaded with leads as before. The two parts of the carbon boat fixture (upper and lower) both loaded with leads, are put together with the heads on the leads opposing and with the capacitors, diodes, etc., interposed between the heads. The leads may be coated with solder and/or its equivalent may be placed at the junctions or interfaces so that when the final assembly is heated the leads and the electronic components therebetween will all be mechanically and electrically connected by the fused solder.

The two parts of the carbon boat fixture normally are made from carbon because after being loaded with the leads, the electronic devices, solder, etc., they must be heated to fuse the solder and thus secure all the components together. The loading fixtures and the transfer plates have in the past been made entirely of metal. The compartments of the loading fixture have in the past been loaded with leads by hand, by the electronic device manufacturer after the nail head leads are removed from their shipping containers.

SUMMARY OF THE INVENTION

According to the present invention the procedures described above may be simplified, and some steps omitted, through the use of a novel loading tray formed of at least two parts, one of which is a shipping tray in which nail head leads are shipped from the lead manufacturer to the electronic device manufacturer.

In the present invention, a different form of loading fixture than previously used is provided, i.e., a loading fixture that has two main components, one component being a permanent metal frame and the other component being a disposable plastic tray. The permanent component, usually of metal, comprises a rigid frame with locating pins and securing means which will locate and secure said frame relative to a transfer plate in the same manner as was done in the prior art, as heretofore explained. However, in the present invention there is provided within said rigid metal frame a disposable plastic tray containing compartments for holding the nail head leads, and from which they are shaken into the holes of the transfer plate. The outer metal component of this new loading fixture, according to the present invention, is retained in the possession of and used solely by the electronic device manufacturer. The inner disposable plastic component of this new loading fixture is provided by the lead manufacturer, and because it is disposable the lead manufacturer can pre-pack it with leads at his plant where the leads are manufactured and use it as the shipping container for the shipment of the leads from the plant where the leads are made to the plant of the electronic device manufacturer where the leads are soldered to the electronic components of the devices to which they are connected.

Thus, by the use of the new two part loading fixture, of the present invention, and the new method of packing and shipping leads and assembling them, the overall manufacturing procedures of electronic devices is simplified and can be made more efficient with a substantial reduction in cost as compared with the practices followed in the prior art.

By this invention, whereby the shipping tray can be used as part of the loading fixture, the loading fixture can in effect be filled with nail head leads by the manufacturer of the nail head leads, and the step of transferring the nail head leads from their shipping container to the loading fixture is entirely eliminated. The electronic device manufacturer need not even unpack the nail head leads from the container in which they are received at his plant; he simply takes the lead container (shipping tray) as received with the leads packed therein, and places it in the metal frame already in his possession to form a complete loading tray. Because the shipping tray is of disposable inexpensive plastic it need not even be returned to the lead manufacturer, but simply thrown away.

BRIEF DESCRIPTION OF THE DRAWINGS

In the accompanying drawings:

FIG. 3 is a perspective view showing the shipping tray of FIG. 1 assembled with the metal frame of FIG. 2, to form a complete loading fixture.

FIG. 4 is a series of cross-sectional views, A through N, showing how the nail head leads are handled, according to the invention, from the first step of packing them in the shipping tray to the last step of placing them in the carbon boats in assembly with the other components of the electronic devices and the soldering material, prior to fusion by the application of heat. Perspective views of typical nail head leads are shown in FIG. 4A above the two arrows which show how they may be placed in a compartment of the shipping tray. A group of said leads, with heads down, are also shown in perspective in one of the compartments of the tray of FIG. 1.

DESCRIPTION OF THE PREFERRED EMBODIMENT

Figure 1:
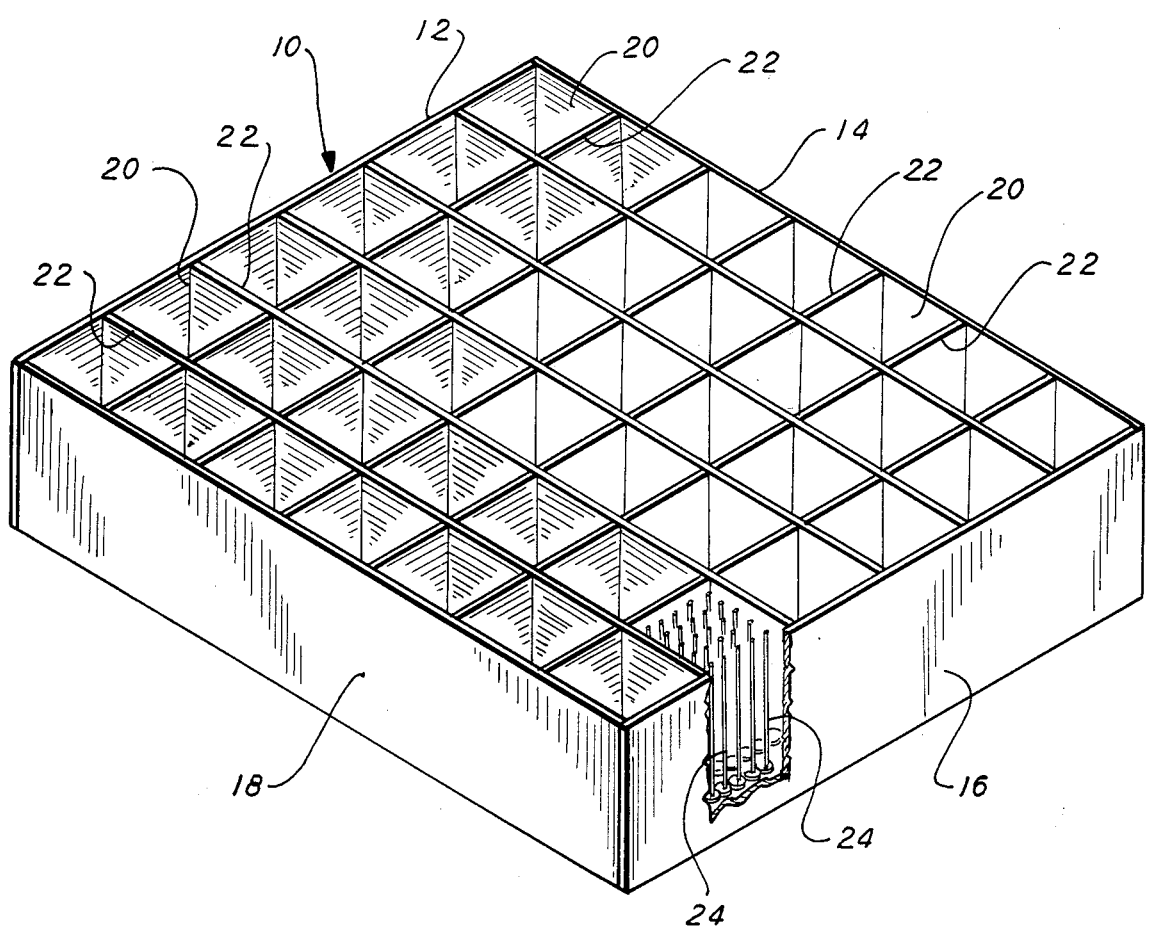
FIG. 1 is a perspective view of the dual use plastic, compartmented, nail head lead container of the present invention. This container is used first as a shipping tray in which the leads are packed by the lead manufacturer for shipment to the electronic device manufacturer. It is then put to a second use by the electronic device manufacturer as a part of the loading fixture used in the assembly of the nail head leads with the other components of the electronic devices.

FIG. 1 of the drawings shows a container 10 (also referred to herein as a "shipping tray") having four side walls 12, 14, 16 and 18 and a bottom wall 19 (see FIG. 4A) all made of a rigid, disposable plastic such as polyvinyl chloride. The container 10 is divided into compartments 20 by divider strips 22, made of polyvinyl chloride strips. In FIG. 1, forty-two such compartments are illustrated.

Each compartment is of a depth equal to the length of the nail head leads it is intended to receive, as illustrated at 24 in FIGS. 1 and 4A. For shipment, each compartment is filled with a quantity of such leads, either with all their heads down as in FIG. 1 or if preferred, all heads up. This orientation of the leads so that their heads are all one way is done by the nail head lead manufacturer, when loading the leads into the compartments of the shipping tray. All compartments of the tray are loosely filled with the leads 24 prior to shipment of the tray so that, as will be hereinafter described, the leads can be shaken out of the tray when it later becomes a part of the loading fixture, and into a transfer plate, by the electronic device manufacturer.

After the compartments of the container 10 as shown in FIG. 1 are thus filled with nail head leads, it becomes a disposable shipping tray, which may be placed in a cardboard box or otherwise prepared in a conventional way for shipment by rail, truck or plane to the elctronic device manufacturer.

Figure 2:
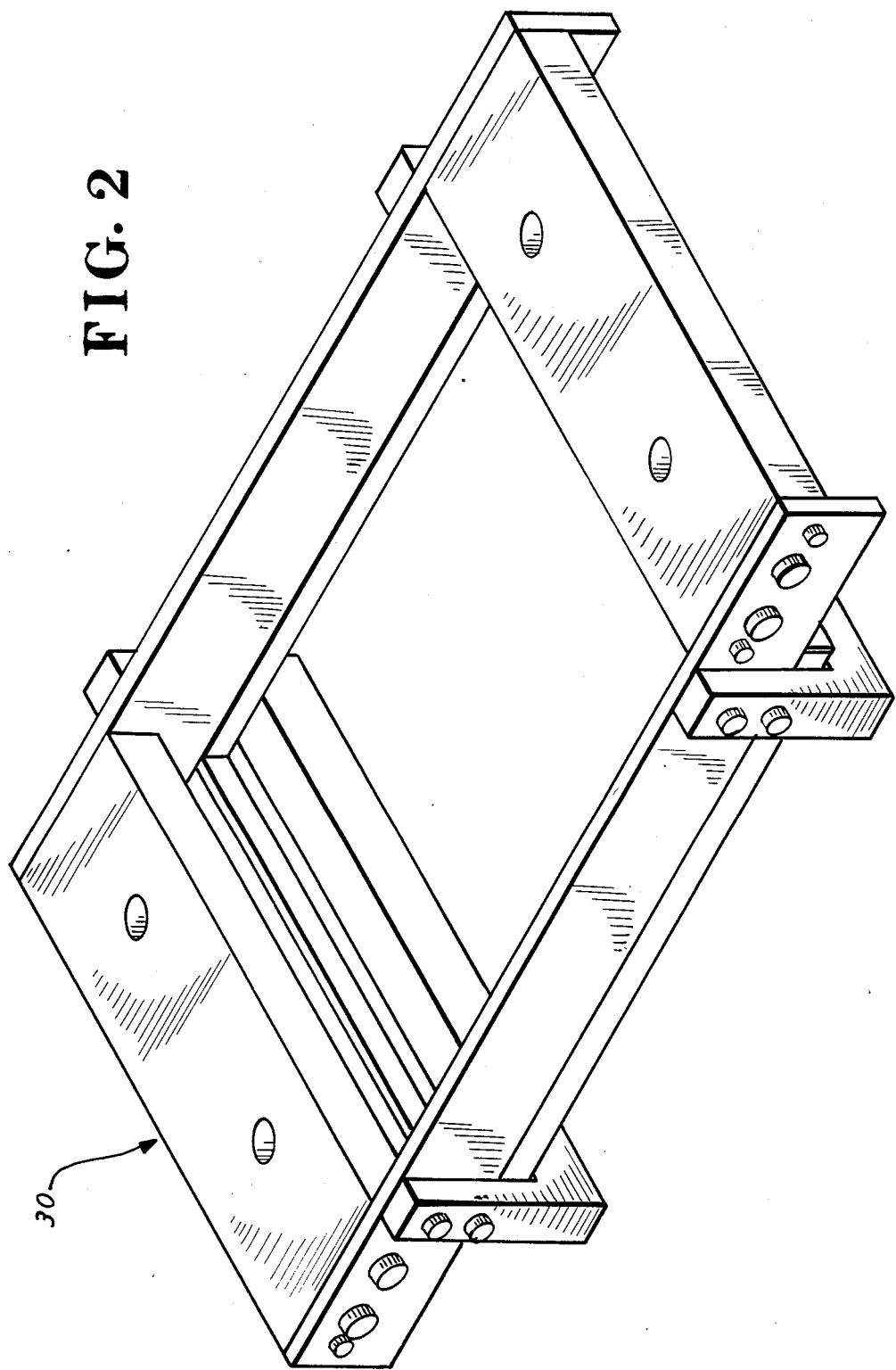
FIG. 2 is a perspective view of the outer metal frame of the loading fixture, into which the shipping tray of FIG. 1 is placed to form the complete loading fixture.

When received by the electronic device manufacturer, the shipping tray, loaded with nail head leads, is taken from its box and placed directly into the metal frame 30 shown in FIG. 2. The shipping tray is so dimensioned as to fit exactly, as received, into the metal frame (already in the possession of the electronic device manufacturer) and when so assembled as shown in FIG. 3 the two together form a loading fixture, like the loading fixture of the prior art except that it is made from two parts, one part being the plastic disposable tray 10 furnished with leads packed therein by the lead manufacturer and the other part being the metal frame 30 (usually made of aluminum) in the possession of the electronic device manufacturer.

This two part loading fixture, FIG. 3, can therefore be used for further assembly operations like the one-part loading fixtures of the prior art, but the work and expense of removing the nail head leads from their shipping packages and placing them by hand or otherwise in the compartments of the loading fixtures have been eliminated. In the present invention, once the nail head leads have been packed into tray 10 by the lead manufacturer, the work of getting them into the loading fixture is complete, because the tray as so packed is simply placed into the space provided for it in the metal frame 30, thus providing a complete loading fixture already packed with nail head leads, in oriented array ready for the next assembly operation.

FIGS. 4A and 4B show respectively the disposable shipping tray 10 partly packed with nail head leads 24 and the said tray filled with nail head leads in place in the aluminum frame 30 of the loading fixture, composed of the two parts 10,30.

The subsequent FIGS. 4C through 4N show how the loading fixture 10,30 is used in the subsequent assembly operations, for the assembly and connection of the nail head leads with the other components of the particular electronic device being manufactured.

In FIG. 4C, an aluminum transfer plate 40 is placed on top of, and aligned by pins 42, the loading fixture 10,30. Transfer plate 40 has a large number of holes 43 therein each of a length and diameter for receiving one of the nail head leads in the tray 10. A shim plate is placed on top of the transfer plate 40 so as to block off the tops of all the holes in the transfer plate.

In FIG. 4D the assembly has been inverted (rotated 180°) so that loading fixture 10,30 is on top and the transfer plate 40 and shim plate 44 are on the bottom. This assembly, as shown in FIG. 4D, is then shaken or vibrated which causes the nail head leads in compartments 20 of tray 10 to align themselves with and then to fall into the holes 43 of the transfer plate. When the holes in the transfer plate are all filled, with one lead in each hole, the assembly is then rotated by 90°, to the position shown in FIG. 4E. The loading fixture is then separated from the transfer plate and removed, as illustrated in FIG. 4F.

The transfer plate 40, with each of its holes 43 filled with one nail head lead 24, is then placed on top of a carbon boat 50, having a plurality of holes 52 therein equal in number and matching in location the holes in the transfer plate 40. However, the holes in the transfer plate are of a larger, uniform, diameter so that the enlarged head on each lead may pass entirely through the hole in which the lead resides, whereas the holes in the carbon boat have a smaller diameter through most of their length and a larger diameter only in that part of the hole intended to receive the head portion of the lead. A shim plate 54 is placed over the bottoms of the holes in the transfer plate as shown in FIG. 46 so as to retain the leads in their holes, at this stage of the assembly.

In FIG. 4H the shim plate has been removed, and the carbon boat and transfer plate are then shaken or vibrated so that the leads in the holes of the transfer plate will fall into the matching holes of the carbon boat. The result is illustrated in FIG. 4I, in which each hole in the carbon boat has been filled with a nail head lead, with the shank of each lead substantially filling its respective hole and the enlarged head portion of each lead substantially filling a counterbore, or head cavity 53 in the carbon boat at the top (as seen in FIG. 4I) of each hole 52.

The transfer plate, having fulfilled its function, is then removed as shown in FIG 4J. The electronic components (capacitors, semi-conductors, etc.) and bits of solder are then placed on top of the head portions of the nail head leads as shown in FIG. 4K. One of the two carbon boats is then completed, and loaded with all components ready for the final joining operation.

Another carbon boat 60 (FIG. 4L) is then filled with nail head leads in the same manner, described above, and a shim plate 62 placed on top thereof to hold the leads and components in place so that the boat, so loaded, may be inverted. This operation is shown by FIG. 4M, in which boat 60, loaded with leads and components retained temporarily in place by shim plate 62, has been inverted (rotated 180°) and placed on the loaded carbon boat 50 as previously prepared. Shim 62 is then removed, which results in the final assembly shown in FIG. 4N, in which the opposing heads of opposing leads have between them the capacitors, semiconductors, etc. to which they are to be electrically and mechanically connected, and in which the bit of solder or other fusible connecting material is also in place between the opposing nail heads.

The final assembly (FIG. 4N) then goes into the oven where the solder or other fusible material is melted and flows into its proper place to electrically and mechanically, and substantially permanently, secure the electronic components to the nail head leads and to each other in their assembled position.

I claim:

1. A component for a loading fixture comprising a rigid frame surrounding an open space containing a compartmented tray adapted to receive a plurality of electrical leads, said frame having locating means thereon for positioning said frame, and the compartments of said tray, in a predetermined location relative to the holes of a transfer plate with which said frame and said tray are to be assembled, said tray being removably retained in said space so that the frame and tray may be handled as a unit and means for attaching said frame and said tray as a unit to a transfer plate having a plurality of holes therein for receiving electrical leads from the compartments of said tray.

2. In combination:
   (a) a rigid frame having side walls enclosing a space within said frame;
   (b) a tray located in said space and having a plurality of compartments each adapted to receive a plurality of electrical leads;
   (c) means for removably retaining said tray in said space so that the frame and tray may be handled as a unit; and
   (d) means for attaching said frame and said tray as a unit to a transfer plate having a plurality of holes therein for receiving electrical leads from the compartments of said tray.

3. The combination of claim 2, in which said frame is made of a material which is suitable for a large number of repeated uses without deterioration and the tray is made of a low cost material which need withstand only a single use prior to disposal.

4. The combination of claim 3, in which the tray is adapted to serve as the shipping container for said electrical leads prior to the placement of the tray, containing said leads, in the said frame.

5. Apparatus for loading discrete nail head leads into the individual holes of a transfer plate, comprising a tray having a multiplicity of compartments each adapted to receive a bundle of nail head leads oriented in said compartments with the longitudinal axes of the leads extending in the direction of the longitudinal axes of the compartments and with the heads of said leads disposed in the same direction, a rigid frame containing an opening for removably receiving said tray and for forming with said tray while the tray is in said opening a fixture for the loading of said leads in said tray compartments into the individual holes of the transfer plate, and means carried by said fixture for aligning said tray compartments with the holes in said transfer plate when the fixture and the plate are assembled in abutting relationship, whereby when the assembled transfer plate and fixture are inverted so that the transfer plate is beneath the fixture, the nail head leads in the tray compartments will drop down into the holes in the transfer plate.

6. Apparatus according to claim 5, in which the tray is formed of a material and is so dimensioned that it may be used commercially as a shipping container for the shipment of the nail head leads from the plant of their manufacture to the plant where the tray, containing said leads, is assembled with said frame to form the loading fixture.

7. A fixture for transferring nail head leads individually from a container thereof into the holes of a transfer plate, comprising a rigid frame having an opening therein for removably receiving said container and the leads therein, means for retaining said container in the said opening so that the frame and container may be handled as a unit which forms a fixture for loading the leads in said container into the holes of a transfer plate placed in abutting relationship with said fixture, the said fixture having a planar upper surface which abuts a planar lower surface on said transfer plate so that leads in said container are retained in said container by said transfer plate when the fixture is inverted except when the holes in the transfer plate are aligned with the leads in the container and thereby permit each of said leads to drop into one of said holes, and means for aligning said leads with said holes.

* * * * *